United States Patent
Ramarajan

(10) Patent No.: US 11,063,593 B2
(45) Date of Patent: Jul. 13, 2021

(54) LEVEL SHIFTER ENABLE

(71) Applicant: Taiwan Semiconductor Manufacturing Company, Ltd., Hsinchu (TW)

(72) Inventor: Srinivasan Ramarajan, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/563,248

(22) Filed: Sep. 6, 2019

(65) Prior Publication Data

US 2020/0136622 A1      Apr. 30, 2020

Related U.S. Application Data

(60) Provisional application No. 62/753,545, filed on Oct. 31, 2018.

(51) Int. Cl.
*H03L 5/00* (2006.01)
*H03K 19/0185* (2006.01)
*H03K 3/037* (2006.01)

(52) U.S. Cl.
CPC ..... *H03K 19/018521* (2013.01); *H03K 3/037* (2013.01)

(58) Field of Classification Search
CPC .................. H03K 3/037; H03K 19/018521
See application file for complete search history.

(56) References Cited

U.S. PATENT DOCUMENTS

| | | | | |
|---|---|---|---|---|
| 7,952,572 B2* | 5/2011 | Ko | ............................ | G09G 3/20 345/204 |
| 8,013,827 B2* | 9/2011 | Kageyama | ........... | G09G 3/3648 345/100 |
| 8,115,533 B2* | 2/2012 | Kim | .................... | H03K 3/35613 327/333 |
| 8,248,348 B2* | 8/2012 | Murakami | ..... | H03K 19/018521 345/98 |
| 10,256,796 B2* | 4/2019 | Hsin | .............. | H03K 19/018521 |
| 2007/0279366 A1 | 12/2007 | Kageyama et al. | | |
| 2010/0301818 A1 | 12/2010 | Kim | | |
| 2011/0032019 A1 | 2/2011 | Saether | | |
| 2017/0264276 A1 | 9/2017 | Sinangil et al. | | |

FOREIGN PATENT DOCUMENTS

| | | |
|---|---|---|
| JP | 2007-322649 A | 12/2007 |
| KR | 10-2010-0128644 A | 12/2010 |
| TW | M565921 U | 8/2018 |
| WO | 2018/005086 A1 | 1/2018 |

* cited by examiner

*Primary Examiner* — Dinh T Le
(74) *Attorney, Agent, or Firm* — Merchant & Gould P.C.

(57) ABSTRACT

A multi-bit level shifter that has a plurality of level shifters, each of which is configured to receive an input signal in a first voltage domain and provide a corresponding output signal in a second voltage domain. The level shifters each have an enable node. An enable circuit includes an output terminal connected to the enable node of each of the plurality of level shifters, and each of the plurality of level shifters is configured to output the corresponding output signals in response an enable signal received by the enable circuit.

20 Claims, 5 Drawing Sheets

LEVEL SHIFTER ENABLE

RELATED APPLICATION

This application claims the benefit of U.S. Provisional Patent Application No. 62/753,545, filed Oct. 31, 2018, the disclosure of which is hereby incorporated by reference in its entirety.

BACKGROUND

Level shifters are widely used components in digital circuits for communicating between two different power domains, one being a low voltage domain and the other being a high voltage domain. For example, a common type of integrated circuit memory is a static random access memory (SRAM) device. A typical SRAM memory device has an array of memory cells. In some examples, each memory cell uses six transistors connected between an upper reference potential and a lower reference potential (typically ground) such that one of two storage nodes can be occupied by the information to be stored, with the complementary information stored at the other storage node. Each bit in the SRAM cell is stored on four of the transistors, which form two cross-coupled inverters. The other two transistors are connected to the memory cell word line to control access to the memory cell during read and write operations by selectively connecting the cell to its bit lines. In a read operation, for example, the memory cell bit lines are precharged to a predefined threshold voltage. When the word line is enabled, a sense amplifier connected to the bit lines senses and outputs stored information. A "dual rail" SRAM architecture refers to an SRAM arrangement where the memory logic is operated in a low voltage domain (VCC), while the memory array is operated in the high voltage domain (VDD). Level shifter circuits are used to shift up the signals going to the SRAM cells.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
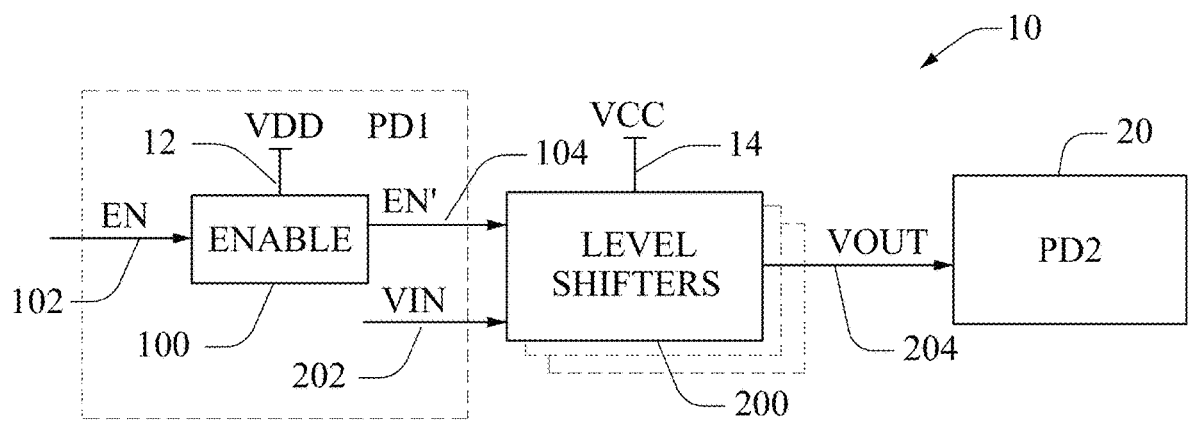
FIG. 1 is a block diagram illustrating aspects of an example level shifter in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A static random access memory (SRAM) device has an array of memory cells that include transistors connected between an upper reference potential and a lower reference potential such that one of two storage nodes can be occupied by the information to be stored, with the complementary information stored at the other storage node. For example, one typical SRAM memory cell arrangement includes six transistors. Each bit in the SRAM cell is stored on four of the transistors, which form two cross-coupled inverters. The other two transistors are connected to the memory cell word line to control access to the memory cell during read and write operations by selectively connecting the cell to its bit lines.

In a read operation, for example, the memory cell bit lines are precharged to a predefined threshold voltage. When the word line is enabled, a sense amplifier connected to the bit lines senses and outputs stored information.

A "dual rail" SRAM architecture refers to an SRAM arrangement where the memory logic is operated in a low voltage domain, while the memory array is operated in a high voltage domain. Known dual rail SRAM arrangements can reduce memory leakage power, but memory access time can be adversely impacted. Further, as the difference between the voltage levels of the high and low voltage domains increases, leakage and noise may increase.

In some known applications, a single-bit level shifter with an enable signal for power isolation is used. The enable signal is received by an enable input terminal, which allows selectively operating the level shifter based on the enable signal. Each bit has a respective level shifter, and each level shifter includes an enable input that receives the enable signal for selective operation of the level shifter. Some typical arrangements of such level shifter circuits require a minimum of five transistors per bit to implement the enable logic, which can consume excess area and power.

In accordance with aspects of the present disclosure, a multi-bit level shifter is provided where the transistors of the enable function may be shared across multiple bits of logic. Accordingly, enable transistors are shared across multiple bits, thereby reducing number of enable transistors required.

FIG. 1 is a block diagram illustrating an example of a multi-bit level shifter 10 in accordance with aspects of the present disclosure. Disclosed examples have a plurality of level shifters 200, each of which has a signal input terminal 202 that is configured to receive an input signal VIN in a first voltage domain PD1 and provide a corresponding output signal VOUT in a second voltage domain PD2 higher than the first voltage domain PD1, at a signal output terminal 204 that is received by system components 20 in the second power domain PD2. The system components 20 may include, for example, a memory circuit such as an SRAM memory array of memory cells that receive the output signals VOUT in the second power domain PD2.

An enable circuit 100 has an output terminal 104 connected to an enable node of each of the plurality of level shifters 200. The level shifters 200 output the output signals VOUT that correspond to the input signals VIN in the second voltage domain PD2 in response an enable signal EN received by the enable circuit 100 at an enable input 102. In some examples, the enable circuit 100 receives the enable signal EN, and processes or modifies it to output a transformed enable signal EN'. For instance, in examples discussed below, the enable circuit 100 inverts the received enable signal EN, and thus the transformed enable signal EN' is the complement of the enable signal EN.

In the example shown in FIG. 1, the enable circuit 100 includes a power supply terminal 12 that receives a supply voltage VDD in the first power domain PD1. Accordingly, the transformed enable signal EN' is output in the first voltage domain VDD. The level shifters 200 each have a power supply terminal 14 that receives a second supply voltage VCC in the second voltage domain PD2.

The level shifter shifts the voltage level of the input signal VIN from VDD to VCC. VCC is higher than VDD, for example, to support a dual rail SRAM arrangement as described above. Thus, if the input signal VIN received by the level shifter 200 is a logic low (at ground voltage VSS), then the ground signal is provided at the output terminal 204. If the input signal VIN is at logic high (VDD), a logic high signal in the second power domain PD2 (VCC) is output.

Figure 2:
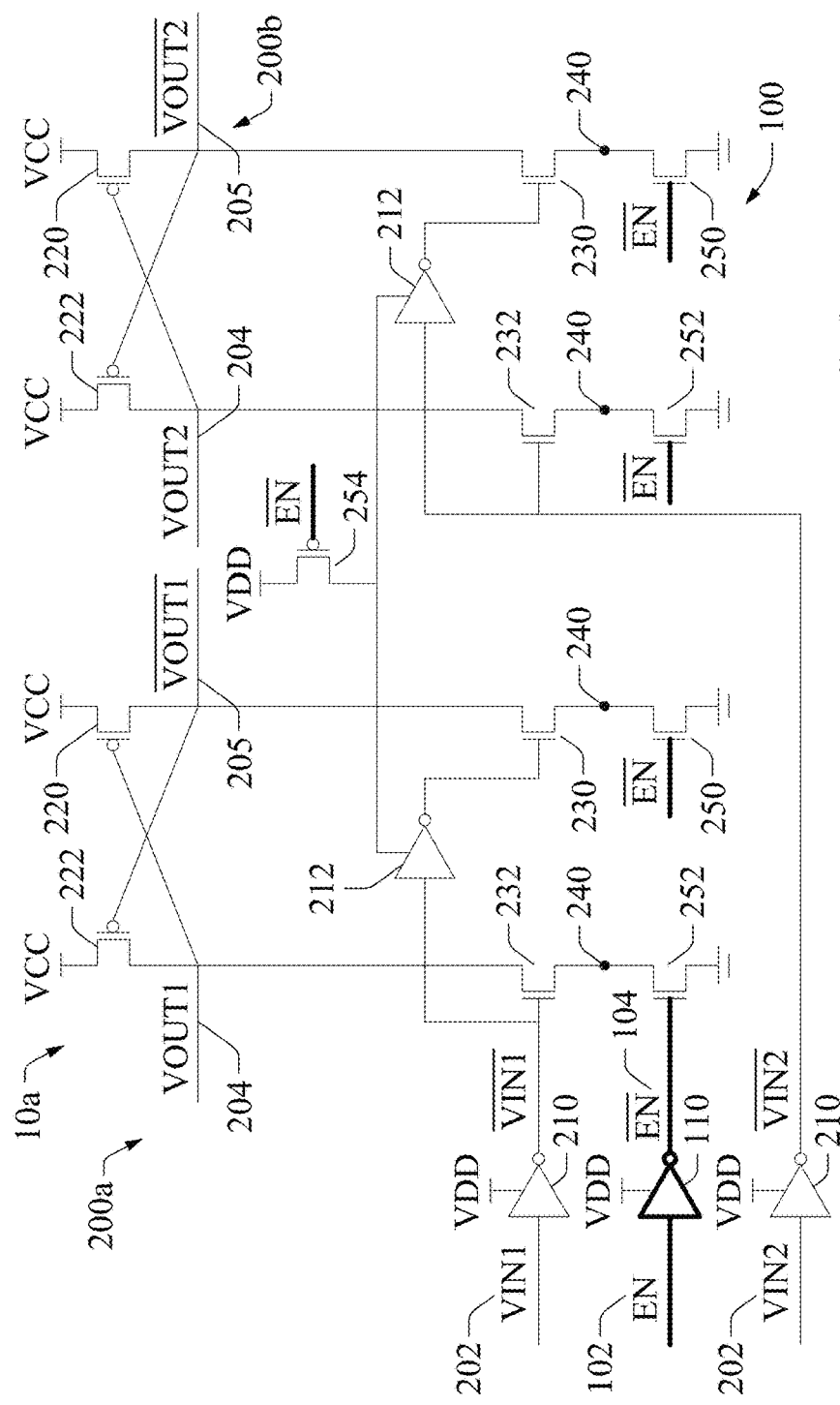
FIG. 2 is a circuit diagram illustrating aspects of an example multi-bit level shifter and enable circuit in accordance with some embodiments.

FIG. 2 is a circuit diagram illustrating further aspects of the multi-bit level shifter 10. In the example shown in FIG. 2, the multi-bit level shifter 10a is a two-bit level shifter, having two level shifters 200a, 200b (collectively referred to as level shifters 200) to provide each output bit in the second power domain PD2. Each of the level shifters 200a, 200b has a first inverter 210 coupled to the first power supply terminal VDD. The first inverters 210 each receive a signal input VIN1, VIN2, at their respective input terminals 202 and provide inverted input signals VIN1_bar, VIN2_bar.

Each of the level shifters 200a, 200b has a first PMOS transistor 220 including a source coupled to the second power supply VCC, and a gate coupled to a first output 204 of the level shifters 200a, 200b to output respective first output signals VOUT1, VOUT2. Each of the level shifters 200a, 200b also has a first NMOS transistor 230 including a drain coupled to a drain of the first PMOS transistor 220 and a gate coupled to the inputs 202 of the level shifters 200a, 200b via the first inverters 210 and second inverters 212.

The level shifters 200a, 200b further each have a second PMOS transistor 222 including a source coupled to the second power supply VCC, and a gate coupled to a drain of the first PMOS transistor 220 and to a second output 205 of the level shifters that outputs complement output signals VOUT1_bar and VOUT2_bar. Second NMOS transistors 232 each have a drain coupled to a drain of the second PMOS transistor 222 and a gate coupled to the level shifter input terminals 202 via the first inverter 210. As will be discussed further below, the sources of the first and second NMOS transistors 230, 232 are each selectively coupled to the circuit ground terminal in response to the enable signal EN received by the enable circuit 100 and thus are sometimes referred to herein as enable nodes 240 of the level shifters 200.

Figure 3:
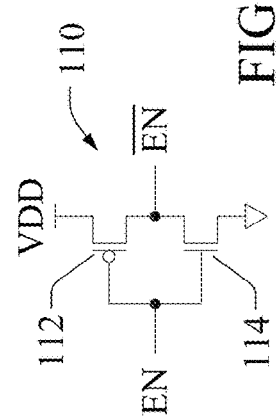
FIG. 3 is circuit diagram illustrating an example of the enable signal inverter of the circuit shown in FIG. 2.

As noted above, in some disclosed examples the enable circuit 100 includes an enable signal inverter. In the example of FIG. 2, an enable signal inverter 110 receives the enable signal EN and outputs an inverted enable signal EN_bar. The enable signal inverter is coupled to the VDD power supply terminal. FIG. 3 illustrates an example CMOS implementation of the enable signal inverter 110, which includes a PMOS transistor 112 having a source connected to the first power supply voltage VDD, a drain connected to the drain of an NMOS transistor 114. The NMOS transistor 114 has a source connected to the ground terminal. The gates of the PMOS and NMOS transistors 112, 114 are connected to receive the enable signal EN, and the connected drains provide a node for outputting the EN_bar signal to the level shifters 200.

The enable circuit 100 further includes first and second control transistors 250, 252 that each receive the output EN_bar of the enable signal inverter 110. In the illustrated example, each of the level shifters 200 has the first and second control transistors 250, 252 connected between the respective first and second NMOS transistors 230, 232 (i.e. the enable nodes 240) and the ground terminal. Thus, each of the plurality of first control transistors 250 has its source connected to the ground terminal, its drain connected to the first NMOS transistor 230 of a respective one of the level shifters 200, and its gate connected to the output of the enable signal inverter 110 to receive the inverted enable signal EN_bar. Similarly, each of the plurality of second control transistors 252 has its source connected to the ground terminal, its drain connected to the second NMOS transistor 232 of a respective one of the level shifters 200, and its gate connected to the output of the enable signal inverter 110 to receive the inverted enable signal EN_bar.

Moreover, the enable circuit 100 includes a third control transistor 254 having its source connected to the VDD power supply terminal, with its drain connected to the respective inverter 212 of each of the plurality of level shifters 200. The gate of the third control transistor 254 is connected to receive the inverted enable signal EN_bar. In the example of FIG. 2, the first and second control transistors 250, 252 of the enable circuit 100 are both NMOS transistors, and the third control transistor 254 of the enable circuit 100 is a PMOS transistor.

Thus, each of the first and second control transistors 250, 252 is configured to selectively connect the enable nodes 240 of the corresponding level shifter 200 to the ground terminal in response to the enable signal EN_bar. The third control transistor 254 is configured to connect the VDD power supply terminal to the respective second inverter 212 of each of the plurality of level shifters 200 in response to the enable signal EN_bar.

Referring to the level shifter 200a as an example, the level shifter 200a provides the output in the second power domain PD2 (VCC voltage level) corresponding to the received input signal VIN1 in response to the enable signal EN, which could be a clocked signal, for example. The output 104 of the enable circuit inverter 110 is received by each of the first, second and third control transistors 250, 252, 254 of the enable circuit 100. For instance, assume the input signal VIN1 and the enable signal EN are both high (VDD). The enable circuit inverter 110 output EN_bar is low, turning off the first and second NMOS control transistors 250, 252 of the enable circuit 100 and isolating the level shifters 200 from ground. The third control transistor 254 of the enable circuit 100 is turned on by the low EN_bar signal, connecting the second inverter 212 of the level shifter to the VDD supply voltage.

The high input signal VIN1 at the signal input terminal 202 is output by the first inverter 210 as a low VIN1_bar signal, which turns off the second NMOS transistor 232. The low VIN1_bar signal is inverted by the first inverter 210, resulting in a high (VDD) signal received at the gate of the first NMOS transistor 230, turning it on. The VOUT1 and VOUT1_bar signals at the level shifter signal output terminals 204, 205 (and the gates of the PMOS transistors 220, 222) are held at their previous levels at least by the first control transistors 250, 252. When the enable signal EN goes low, the high EN_bar signal turns off the third control transistor 254 and turns on the first and second control transistors 250, 252. As noted above, the inverted VIN1_bar signal turned on the first NMOS transistor 230, which together with the first control transistor 250 provides a path to ground for the second level shifter output terminal 205, pulling the VOUT1_bar signal low. The low VOUT1_bar signal turns on the second PMOS transistor 222, connecting the VCC supply voltage to the first level shifter output terminal 204, pulling the VOUT1 signal high in the second power domain PD2 (i.e. VCC). The high VOUT1 signal also turns off the PMOS transistor 220.

When the VIN1 signal transitions to low, the level shifter 200 is configured to output a low VOUT1 signal at the first output 204 and a high VOUT1_bar signal in the second power domain PD2 (VCC). As noted above, when the enable signal EN is high, the enable circuit inverter 110 output EN_bar is low, turning off the first and second NMOS control transistors 250, 252 of the enable circuit 100. The third control transistor 254 of the enable circuit 100 is turned on by the low EN_bar signal, connecting the second inverter 212 of the level shifter to the VDD supply voltage.

The low input signal VIN1 at the signal input terminal 202 is output by the first inverter 210 as a high VIN1_bar signal, which turns on the second NMOS transistor 232. The high VIN1_bar signal is inverted by the first inverter 210, resulting in a low signal received at the gate of the first NMOS transistor 230, turning it off. The high VOUT1 and low VOUT1_bar signals at the level shifter signal output terminals 204, 205 remain at their previous levels held at least by the first and second control transistors 250, 252 being off. When the enable signal EN goes low, the high EN_bar signal turns off the third control transistor 254 and turns on the first and second control transistors 250, 252. As noted above, the VIN1_bar signal turned on the second NMOS transistor 232, which together with the second control transistor 252 provides a path to ground for the level shifter output terminal 204, pulling the high VOUT1 signal low. The low VOUT1 signal turns on the first PMOS transistor 220, connecting the VCC supply voltage to the second level shifter output terminal 204, pulling the low VOUT1_bar signal high in the second power domain PD2 (i.e. VCC). The high VOUT1_bar signal also turns off the PMOS transistor 222.

Figure 4:
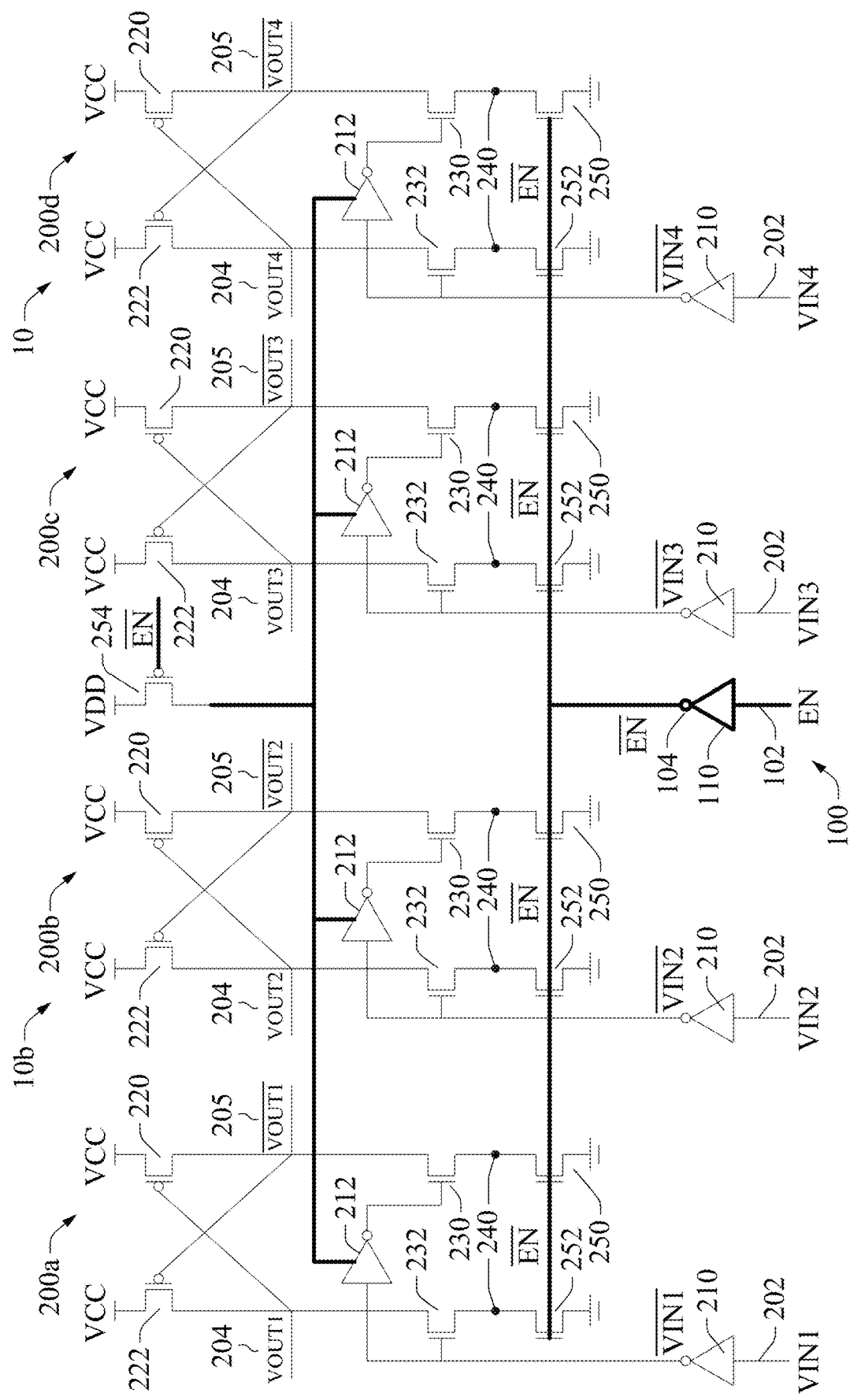
FIG. 4 is a circuit diagram illustrating aspects of another example multi-bit level shifter and enable circuit in accordance with some embodiments.

FIG. 4 is a circuit diagram illustrating an example of a four-bit level shifter 10b, having four level shifters 200a, 200b, 200c, 200d (collectively referred to as level shifters 200) to provide each output bit in the second power domain PD2. As with the two-bit level shifter of FIG. 2, each of the level shifters 200 of the four-bit level shifter has a first inverter 210, which each receive a signal input VIN1, VIN2, VIN3, VIN4 at their respective input terminals 202 and provide inverted input signals VIN1_bar, VIN2_bar, VIN3_bar, VIN4_bar.

Each of the level shifters 200 has a first PMOS transistor 220 including a source coupled to the second power supply VCC, and a gate coupled to a first output 204 of the level shifters 200 to output respective first output signals VOUT1, VOUT2, VOUT3, VOUT4. Each of the level shifters 200 also has a first NMOS transistor 230 including a drain coupled to a drain of the first PMOS transistor 220 and a gate coupled to the inputs 202 of the level shifters 200a, 200b via inverters 210 and 212.

The level shifters 200 further each have a second PMOS transistor 222 including a source coupled to the second power supply VCC, and a gate coupled to a drain of the first PMOS transistor 220 and to a second output 205 of the level shifters that outputs complement output signals VOUT1_bar, VOUT2_bar, VOUT3_bar, VOUT4_bar. Second NMOS transistors 232 each have a drain coupled to a drain of the second PMOS transistor 222 and a gate coupled to the level shifter input terminals 202 via the first inverter 210. The sources of the first and second NMOS transistors 230, 232 are each coupled to the circuit ground terminal in response to the enable signal EN received by the enable circuit 100 and thus function as enable nodes 240 of the level shifters 200.

The enable circuit 100 of the illustrated example four-bit level shifter includes an enable signal inverter 110, which may comprise the CMOS enable signal inverter 110 shown in FIG. 3. The enable signal inverter 110 receives the enable signal EN and outputs the inverted enable signal EN_bar. The enable signal inverter 110 operates in the first power domain PD1 (i.e. is coupled to the VDD power supply).

The enable circuit 100 further includes a plurality of first and second control transistors 250, 252 that each receive the output EN_bar of the enable signal inverter 110. In the illustrated example, each of the level shifters 200 has the first and second control transistors 250, 252 connected between the respective first and second NMOS transistors 230, 232 (i.e. the enable nodes 240) and the ground terminal. Thus, each of the plurality of first control transistors 250 has its source connected to the ground terminal, its drain connected to the first NMOS transistor 230 of a respective one of the level shifters 200, and its gate connected to the output of the enable signal inverter 110 to receive the inverted enable signal EN_bar. Similarly, each of the plurality of second control transistors 252 has its source connected to the ground terminal, its drain connected to the second NMOS transistor 232 of a respective one of the level shifters 200, and its gate connected to the output of the enable signal inverter 110 to receive the inverted enable signal EN_bar.

The enable circuit 100 further includes a third control transistor 254 having its source connected to the VDD power supply terminal, with its drain connected to the respective second inverter 212 of each of the plurality of level shifters 200. The gate of the third control transistor 254 is connected to receive the inverted enable signal EN_bar. In the illustrated example, the first and second control transistors 250, 252 of the enable circuit 100 are both NMOS transistors, and the third control transistor 254 of the enable circuit 100 is a PMOS transistor.

Thus, each of the first and second control transistors 250, 252 is configured to selectively connect the enable nodes 240 of the corresponding level shifter 200 to the ground terminal in response to the enable signal EN_bar. The third control transistor 254 is configured to connect the VDD power supply terminal to the respective second inverter 212 of each of the plurality of level shifters 200 in response to the enable signal EN_bar.

In the illustrated examples, the number of transistors required to implement the enable circuit 100 may be determined according to (nbit*2)+3 where nbit is a number of level shifters of the multi-bit level shifter, and where nbit is an integer>=2.

Referring back to FIG. 2, an example two-bit level shifter is illustrated. Thus, in the embodiment shown in FIG. 2, nbit=2. Accordingly, the enable circuit 100 of the illustrated two-bit level shifter has a total of seven transistors: transistors 112 and 114 of the enable signal inverter 110; the third control transistor 254; the first and second control transistors 250, 252 corresponding to the first level shifter 200a; and the first and second control transistors 250, 252 corresponding to the second level shifter 200b.

FIG. 4 illustrates an example of a four-bit level shifter, where nbit=4. The enable circuit 100 of the illustrated four-bit level shifter thus has a total of 11 transistors: transistors 112 and 114 of the enable signal inverter 110; the third control transistor 254; the first and second control transistors 250, 252 corresponding to the first level shifter 200a; the first and second control transistors 250, 252 corresponding to the second level shifter 200b; the first and second control transistors 250, 252 corresponding to the third level shifter 200c; and the first and second control transistors 250, 252 corresponding to the fourth level shifter 200d.

Some known multi-bit level shifters may require an entirely separate enable circuit for each bit of the level shifter. In contrast, embodiments disclosed herein "share" some components of the enable circuit 100 among each bit of the level shifter. For instance, the enable signal inverter 110 and the third control transistor 254 are coupled to each bit of the level shifter, reducing the number of components required to implement the enable circuit 100 and thus, the level shifter 10 itself. Accordingly, the reduction in transistors as compared to previous level shifters may be determined according to (nbit*5)−[(nbit*2)+3]

where nbit is a number of level shifters of the multi-bit level shifter, and where nbit is an integer>=2.

For example, for the two-bit level shifter shown in FIG. 2, the number of enable transistors is reduced from 10 to 7 as compared to previous level shifter arrangements. For a three-bit level shifter, the number of enable transistors can be reduced from 15 to 9, and for the four-bit level shifter shown in FIG. 4, the number of enable transistors is be reduced from 20 to 11. Thus, by sharing enable logic components, significant area and power savings are achieved according to aspects of the present disclosure.

Figure 5:
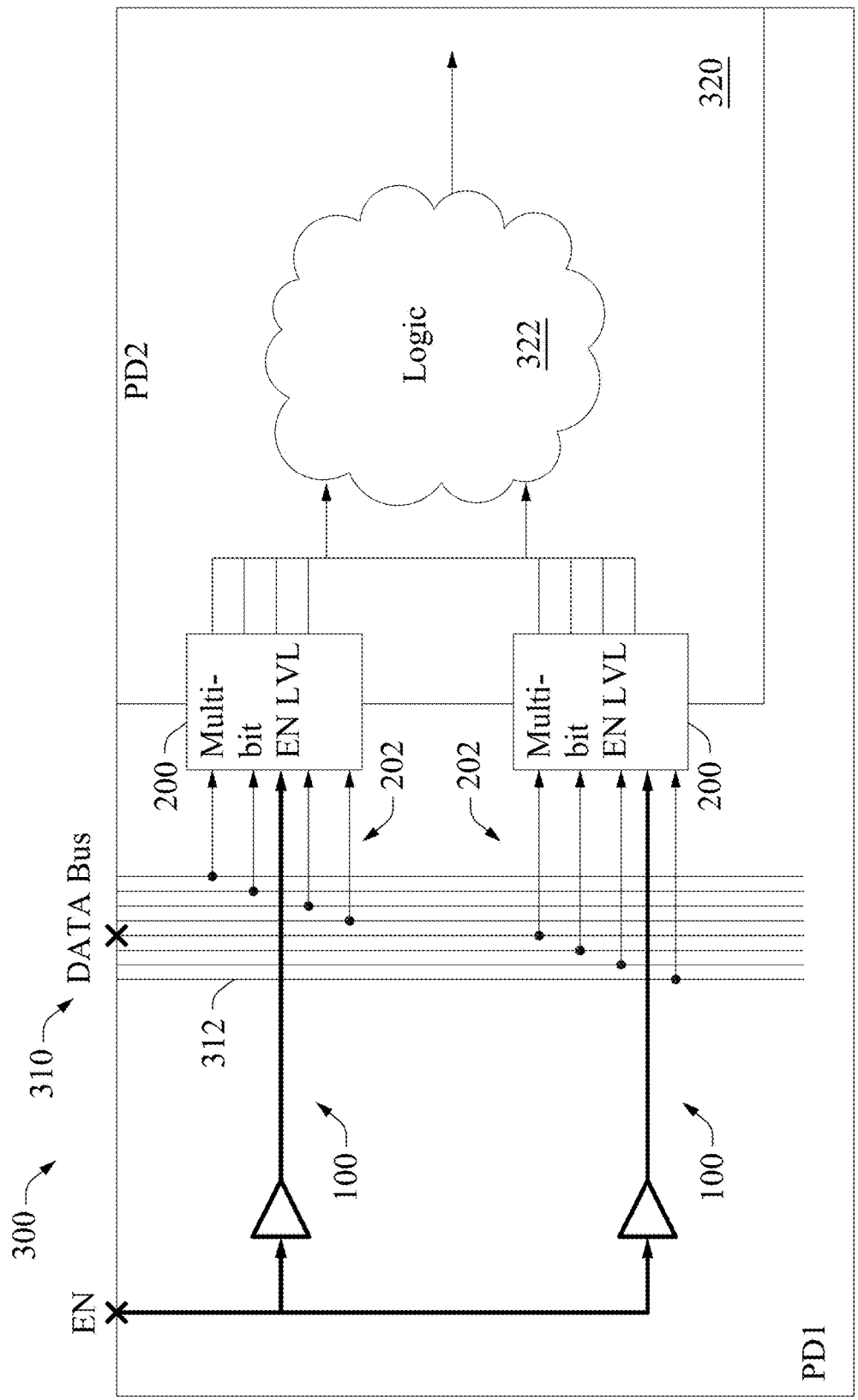
FIG. 5 is a block diagram illustrating aspects of an example system-on-chip (SOC) including a level shifter in accordance with some embodiments.

FIG. 5 illustrates an example of a system-on-chip (SOC) system 300 employing a plurality of multi-bit level shifters 200 in accordance with aspects of the disclosure. The SOC system 300 includes a data bus 310 operating in the first power domain PD1, as well as a device 320 including logic circuits 322 operating in the second power domain PD2. The data bus 310 includes a plurality of data lines 312 connected to respective ones of the signal input terminals 202 of the multi-bit level shifters 200. Data signals from the data bus 310 are output to the signal input terminals 202 of each of the multi-bit level shifters 200, which operate to shift the data signals from the first power domain PD1 to the second power domain PD2 in response to the enable signal EN received by the enable circuit 100. As with the embodiments discussed above, the enable circuits 100 shown in FIG. 5 "share" components, such as the enable signal inverters 110 coupled to the level shifters 200. This facilitates implementation of the multi-bit level shifters 200 (including the enable circuits 100) using fewer components.

Figure 6:
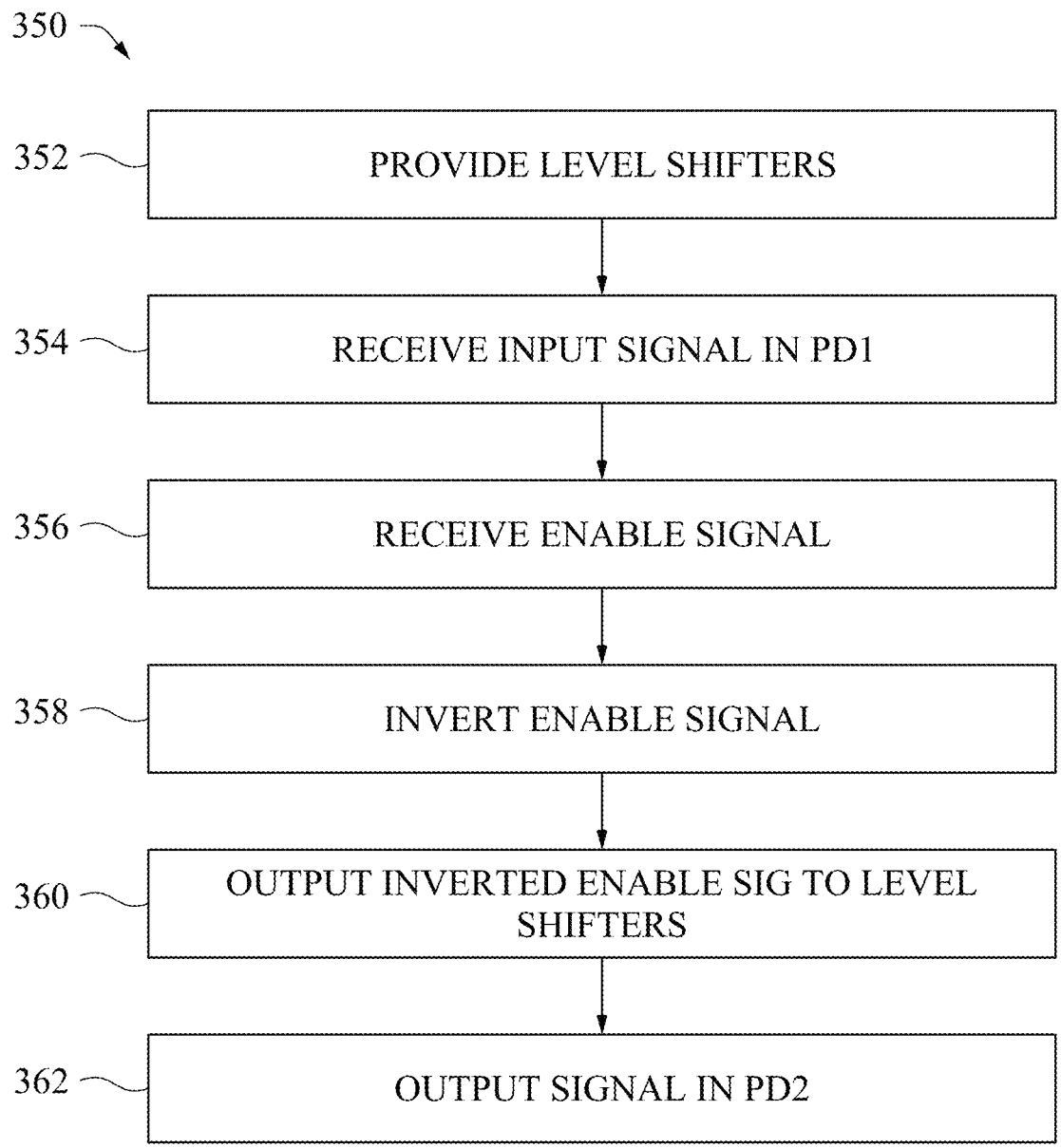
FIG. 6 is a flow diagram illustrating aspects of an example method in accordance with some embodiments.

FIG. 6 is a process flow diagram illustrating aspects of an example level shifting method 350 in accordance with disclosed embodiments. Referring to FIG. 6 in conjunction with the multi-bit level shifters illustrated in FIGS. 1-4, a plurality of level shifters, such as the level shifters 200 are provided in an operation 352. In an operation 354, a respective input signal in a first voltage domain PD1 is received by each of the plurality of level shifters 200, at the signal input terminal 202, for example. In operation 356, an enable signal EN is received, such as at the enable signal input terminal 102 of the enable circuit 100. In operation 358, the enable signal EN is inverted by the enable signal inverter 110, resulting in the inverted enable signal EN_bar output by the inverter 110. The inverted enable signal EN_bar is output to each of the plurality of level shifters 200 in operation 360. More particularly, in the examples discussed in accordance with FIGS. 1-4, the inverted enable signal EN_bar is received by first, second, and third control transistors 250, 252, and 254. Each of the level shifters 200 has the first and second control transistors 250, 252 connected between the respective second and first output terminals 205, 204 (via the first and second NMOS transistors 230, 232) and the ground terminal. The gates of each of the first and second control transistors 250, 252 are connected to the output of the enable signal inverter 110 to receive the inverted enable signal EN_bar. The third control transistor 254 is connected between the VDD power supply terminal and each of a respective inverter 212 of each level shifter 200. The gate of the third control transistor 254 receives the inverted enable signal EN_bar.

At operation 362, an output signal VOUT is provided at a first output terminal 204 of each of the level shifters 200 corresponding to the respective input signal VIN in a second voltage domain PD2 higher than the first domain PD1 in response to the inverted enable signal EN_bar.

Disclosed embodiments thus provide an enable circuit 100 for a multi-bit level shifter 200 comprised of fewer transistors than required for previous level shifters. Some examples disclose a multi-bit level shifter that has a plurality of level shifters, each of which is configured to receive an input signal in a first voltage domain and provide a corresponding output signal in a second voltage domain. The level shifters each have an enable node. An enable circuit includes an output terminal connected to the enable node of each of the plurality of level shifters, and each of the plurality of level shifters is configured to output the corresponding output signals in response an enable signal received by the enable circuit.

In accordance with further aspects, a level shifter enable circuit includes an inverter configured to receive a first power supply voltage, and has input and output terminals. The level shifter enable circuit further includes a plurality of first control transistors, each of which has a source connected to a ground terminal, a gate connected to the output terminal of the inverter, and a drain connected to a respective one of a plurality of level shifters. A plurality of second control transistors each have a source connected to a ground terminal, a gate connected to the output terminal of the inverter, and a drain connected to the respective one of the plurality of level shifters. A third control transistor has a source configured to receive a second power supply voltage higher than the first power supply voltage, a gate connected to the output terminal of the inverter, and a drain connected to each of the plurality of level shifters.

In accordance with still further aspects, a level shifting method includes providing a plurality of level shifters. A respective input signal in a first voltage domain is received by each of the plurality of level shifters. An enable signal is received and inverted. The inverted enable signal is output to each of the plurality of level shifters. An output signal that corresponds to the respective input signal is provided at a first output terminal of each of the level shifters in a second voltage domain higher than the first power domain in response to the inverted enable signal.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A multi-bit level shifter, comprising:
   a plurality of level shifters, each configured to receive an input signal in a first voltage domain and provide a corresponding output signal in a second voltage domain, each of the plurality of level shifters including an enable node; and
   an enable circuit having an output terminal connected to the enable node of each of the plurality of level shifters, the enable circuit configured to receive a first enable signal and output a second enable signal to the enable node of each of the plurality of level shifters;
   wherein each of the plurality of level shifters is configured to output the corresponding output signal in response to the second enable signal output by the enable circuit;
   wherein the enable circuit includes a first power supply terminal configured to receive a first voltage in the first power domain, and wherein the plurality of level shifters each include a second power supply terminal configured to receive a second voltage in the second voltage domain.

2. The multi-bit level shifter of claim 1, wherein the enable circuit includes an enable signal inverter configured to receive the first enable signal and an output configured to provide the second enable signal, wherein the second enable signal is a complement signal of the first enable signal, wherein the enable signal inverter is coupled to the first power supply terminal.

3. The multi-bit level shifter of claim 1, further comprising:
   a data bus having a plurality of data lines, each of the data lines connected to provide the input signal in the first voltage domain to a respective one of the plurality of level shifters; and
   a logic circuit configured to receive the output signals in the second voltage domain from the plurality of level shifters.

4. The multi-bit level shifter of claim 2, wherein each of the level shifters includes:

an inverter coupled to the first power supply terminal, the inverter having an input coupled to an input of the level shifter;
   a first PMOS transistor including a source coupled to the second power supply terminal, and a gate coupled to a first output of the level shifter;
   a second inverter having an input connected to an output of the first inverter;
   a first NMOS transistor including a drain coupled to a drain of the first PMOS transistor and a gate coupled to an output of the second inverter, wherein the enable node of the level shifter includes a source of the first NMOS transistor;
   a second PMOS transistor including a source coupled to the second power supply terminal, and a gate coupled to a drain of the first PMOS transistor and to a second output of the level shifter; and
   a second NMOS transistor including a drain coupled to a drain of the second PMOS transistor and a gate coupled to the output of the first inverter, wherein the enable node of the level shifter includes a source of the second NMOS transistor;
   wherein the first output of the level shifter is configured to provide the corresponding output signal in the second voltage domain, and the second output of the level shifter is configured to provide a complementary output signal in the second voltage domain.

5. The multi-bit level shifter of claim 4, wherein the enable circuit includes:
   a plurality of first control transistors, each of the first control transistors having a source connected to the ground terminal, a drain connected to the first NMOS transistor of a respective one of the level shifters, and a gate connected to the output of the enable signal inverter; and
   a plurality of second control transistors, each of the second control transistors having a source connected to the ground terminal, a drain connected to the second NMOS transistor of a respective one of the level shifters, and a gate connected to the output of the enable signal inverter.

6. The multi-bit level shifter of claim 5, wherein the enable circuit includes a third control transistor having a source connected to the first power supply terminal, a drain connected to the second inverter of each of the plurality of level shifters, and a gate connected to the output of the enable signal inverter.

7. The multi-bit level shifter of claim 6, wherein each of the first and second control transistors are configured to connect the enable node of the corresponding level shifter to the ground terminal in response to the second enable signal.

8. The multi-bit level shifter of claim 6, wherein the third control transistor is configured to connect the second power supply terminal to each of the second inverters of the plurality of level shifters in response to the second enable signal.

9. The multi-bit level shifter of claim 6, wherein the enable circuit comprises a number of transistors determined according to (nbit*2)+3, where nbit is a number of level shifters of the plurality of level shifters, and where nbit is an integer>=2.

10. The multi-bit level shifter of claim 1, further comprising a data bus having a plurality of data lines, each of the plurality of level shifters connected to a respective one of the plurality of data lines and configured to receive the input signal in the first voltage domain from the respective data line.

11. A method, comprising:
providing a plurality of level shifters;
receiving a respective input signal in a first voltage domain by each of the plurality of level shifters;
receiving an enable signal by an enable circuit;
inverting the received enable signal by the enable circuit; and
outputting the inverted enable signal from the enable circuit to each of the plurality of level shifters;
providing an output signal in a second voltage domain higher than the first power domain at a first output terminal of each of the level shifters corresponding to the respective input signal in response to the inverted enable signal.

12. The method of claim 11, further comprising:
inverting each of the respective input signals in the first domain in response to the inverted enable signal; and
providing a complement output signal at a second output terminal of each of the level shifters corresponding to the respective inverted input signal in the second voltage domain in response to the inverted enable signal.

13. The method of claim 12, further comprising:
each of the plurality of level shifters including an inverter; and
providing a control transistor connected between a power supply terminal in the first power domain and each of the inverters, the control transistor having a gate configured to receive the inverted enable signal;
wherein inverting each of the respective input signals in the first domain in response to the inverted enable signal includes connecting each of the inverters to the power supply terminal in the first power domain in response to receiving the inverted enable signal at the gate of the control transistor.

14. The method of claim 12, further comprising:
providing a plurality of first control transistors, each of the plurality of level shifters having one of the first control transistors connected between the first output terminal and a ground terminal, and each of the first control transistors having a gate configured to receive the inverted enable signal; and
providing a plurality of second control transistors, each of the plurality of level shifters having one of the second control transistors connected between the second output terminal and the ground terminal, and each of the second control transistors having a gate configured to receive the inverted enable signal;
wherein providing the output signal at the first output terminal and providing the complement output signal at the second output terminal of each of the level shifters includes connecting the first or second output terminal to the ground terminal in response to receiving the inverted enable signal at the gates of the first and second control transistors.

15. A multi-bit level shifter, comprising:
a plurality of level shifters, each configured to receive an input signal in a first voltage domain and provide a corresponding output signal in a second voltage domain, each of the plurality of level shifters including an enable node;
a data bus having a plurality of data lines, each of the plurality of level shifters connected to a respective one of the plurality of data lines and configured to receive the input signal in the first voltage domain from the respective data line; and
an enable circuit having an output terminal connected to the enable node of each of the plurality of level shifters;
wherein each of the plurality of level shifters is configured to output the corresponding output signal in response to an enable signal received by the enable circuit.

16. The multi-bit level shifter of claim 15, further comprising:
a logic circuit configured to receive the output signals in the second voltage domain from the plurality of level shifters.

17. The multi-bit level shifter of claim 15, wherein the enable circuit includes a first power supply terminal configured to receive a first voltage in the first power domain, and wherein the plurality of level shifters each include a second power supply terminal configured to receive a second voltage in the second voltage domain.

18. The multi-bit level shifter of claim 17, wherein the enable circuit includes an enable signal inverter configured to receive the first enable signal and an output configured to provide the second enable signal, wherein the second enable signal is a complement signal of the first enable signal, wherein the enable signal inverter is coupled to the first power supply terminal.

19. The multi-bit level shifter of claim 18, wherein each of the level shifters includes:
an inverter coupled to the first power supply terminal, the inverter having an input coupled to an input of the level shifter;
a first PMOS transistor including a source coupled to the second power supply terminal, and a gate coupled to a first output of the level shifter;
a second inverter having an input connected to an output of the first inverter;
a first NMOS transistor including a drain coupled to a drain of the first PMOS transistor and a gate coupled to an output of the second inverter, wherein the enable node of the level shifter includes a source of the first NMOS transistor;
a second PMOS transistor including a source coupled to the second power supply terminal, and a gate coupled to a drain of the first PMOS transistor and to a second output of the level shifter; and
a second NMOS transistor including a drain coupled to a drain of the second PMOS transistor and a gate coupled to the output of the first inverter, wherein the enable node of the level shifter includes a source of the second NMOS transistor;
wherein the first output of the level shifter is configured to provide the corresponding output signal in the second voltage domain, and the second output of the level shifter is configured to provide a complementary output signal in the second voltage domain.

20. The method of claim 12, further comprising:
providing a data bus having a plurality of data lines;
providing the input signals in the first voltage domain to the respective ones of the plurality of level shifters; and
providing the output signals from the first output terminal of each of the level shifters to a logic circuit.

* * * * *